US008939760B2

(12) United States Patent
Li et al.

(10) Patent No.: US 8,939,760 B2
(45) Date of Patent: Jan. 27, 2015

(54) SPIKE ANNEAL RESIDENCE TIME REDUCTION IN RAPID THERMAL PROCESSING CHAMBERS

(75) Inventors: Jiping Li, Palo Alto, CA (US); Blake Koelmel, Mountain View, CA (US); Aaron Muir Hunter, Santa Cruz, CA (US); Wolfgang R. Aderhold, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 505 days.

(21) Appl. No.: 13/370,164

(22) Filed: Feb. 9, 2012

(65) Prior Publication Data

US 2013/0206362 A1    Aug. 15, 2013

(51) Int. Cl.
   *F27D 15/02*    (2006.01)

(52) U.S. Cl.
   USPC ............................... 432/81; 219/411; 392/416

(58) Field of Classification Search
   CPC ....................................................... G01J 5/0007
   USPC ..................... 432/77, 227, 230; 219/390, 405; 392/418
   See application file for complete search history.

(56) References Cited

U.S. PATENT DOCUMENTS

| | | | |
|---|---|---|---|
| 7,378,618 B1 * | 5/2008 | Sorabji et al. | 219/411 |
| 7,812,286 B2 * | 10/2010 | Sorabji et al. | 219/390 |
| 8,222,574 B2 * | 7/2012 | Sorabji et al. | 219/444.1 |
| 8,658,947 B2 * | 2/2014 | Sorabji et al. | 219/411 |
| 2005/0145614 A1 * | 7/2005 | Wu et al. | 219/390 |
| 2007/0141846 A1 | 6/2007 | Nam | |
| 2008/0142497 A1 * | 6/2008 | Sorabji et al. | 219/393 |
| 2010/0008656 A1 * | 1/2010 | Sorabji et al. | 392/416 |
| 2010/0193154 A1 * | 8/2010 | Aderhold et al. | 165/61 |
| 2011/0061810 A1 * | 3/2011 | Ganguly et al. | 156/345.27 |
| 2011/0089166 A1 * | 4/2011 | Hunter et al. | 219/647 |

FOREIGN PATENT DOCUMENTS

| | | | |
|---|---|---|---|
| KR | 20030086951 A | 11/2003 | |
| KR | 20080055608 A | 6/2008 | |
| KR | 20110108420 A | 10/2011 | |

OTHER PUBLICATIONS

International Search Report and Written Opinion dated Jun. 2, 2013 for Application No. PCT/US13/025377.

* cited by examiner

Primary Examiner — Gregory A Wilson
(74) Attorney, Agent, or Firm — Patterson & Sheridan, LLP

(57) ABSTRACT

The present invention generally relates to methods of cooling a substrate during rapid thermal processing. The methods generally include positioning a substrate in a chamber and applying heat to the substrate. After the temperature of the substrate is increased to a desired temperature, the substrate is rapidly cooled. Rapid cooling of the substrate is facilitated by increasing a flow rate of a gas through the chamber. Rapid cooling of the substrate is further facilitated by positioning the substrate in close proximity to a cooling plate. The cooling plate removes heat from substrate via conduction facilitated by gas located therebetween. The distance between the cooling plate and the substrate can be adjusted to create a turbulent gas flow therebetween, which further facilitates removal of heat from the substrate. After the substrate is sufficiently cooled, the substrate is removed from the chamber.

20 Claims, 4 Drawing Sheets

SPIKE ANNEAL RESIDENCE TIME REDUCTION IN RAPID THERMAL PROCESSING CHAMBERS

BACKGROUND OF THE INVENTION

1. Field of the Invention

Embodiments of the present invention generally relate to rapid thermal processing.

2. Description of the Related Art

Rapid thermal processing includes rapidly heating and then cooling a substrate to form junctions on the substrate. The more quickly a substrate is heated and cooled, the shorter the residence time of the substrate within the rapid thermal processing (RTP) chamber. Shorter residence times increase substrate throughput as well as enable shallower junction formation. Shallower junctions are desirable due to enhanced device performance.

Therefore, there is a need for reducing the residence time of a substrate within an RTP chamber.

SUMMARY OF THE INVENTION

The present invention generally relates to methods of cooling a substrate during rapid thermal processing. The methods generally include positioning a substrate in a chamber and applying heat to the substrate. After the temperature of the substrate is increased to a desired temperature, the substrate is rapidly cooled. Rapid cooling of the substrate is facilitated by increasing a flow rate of a gas through the chamber. Rapid cooling of the substrate is further facilitated by positioning the substrate in close proximity to a cooling plate. The cooling plate removes heat from substrate via conduction facilitated by gas located therebetween. The distance between the cooling plate and the substrate can be adjusted to create a turbulent gas flow therebetween, which further facilitates removal of heat from the substrate. After the substrate is sufficiently cooled, the substrate is removed from the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally relates to methods of cooling a substrate during rapid thermal processing. The methods generally include positioning a substrate in a chamber and applying heat to the substrate. After the temperature of the substrate is increased to a desired temperature, the substrate is rapidly cooled. Rapid cooling of the substrate is facilitated by increasing a flow rate of a gas through the chamber. Rapid cooling of the substrate is further facilitated by positioning the substrate in close proximity to a cooling plate. The cooling plate removes heat from substrate via conduction facilitated by gas located therebetween. The distance between the cooling plate and the substrate can be adjusted to create a turbulent gas flow therebetween, which further facilitates removal of heat from the substrate. After the substrate is sufficiently cooled, the substrate is removed from the chamber.

Figure 1A:
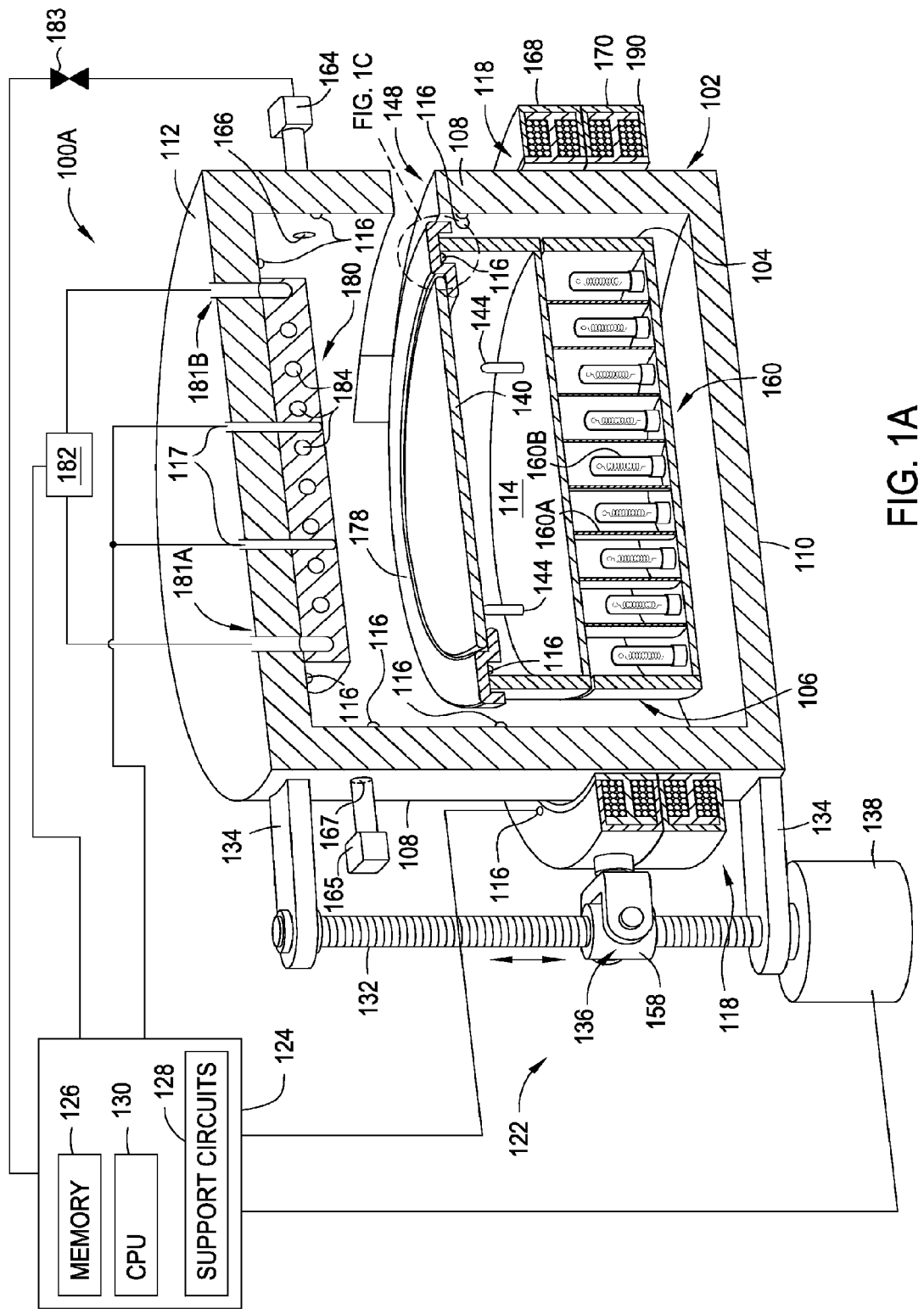
FIGS. 1A and 1B are isometric sectional views of chambers according to embodiments of the invention.
Figure 1B:
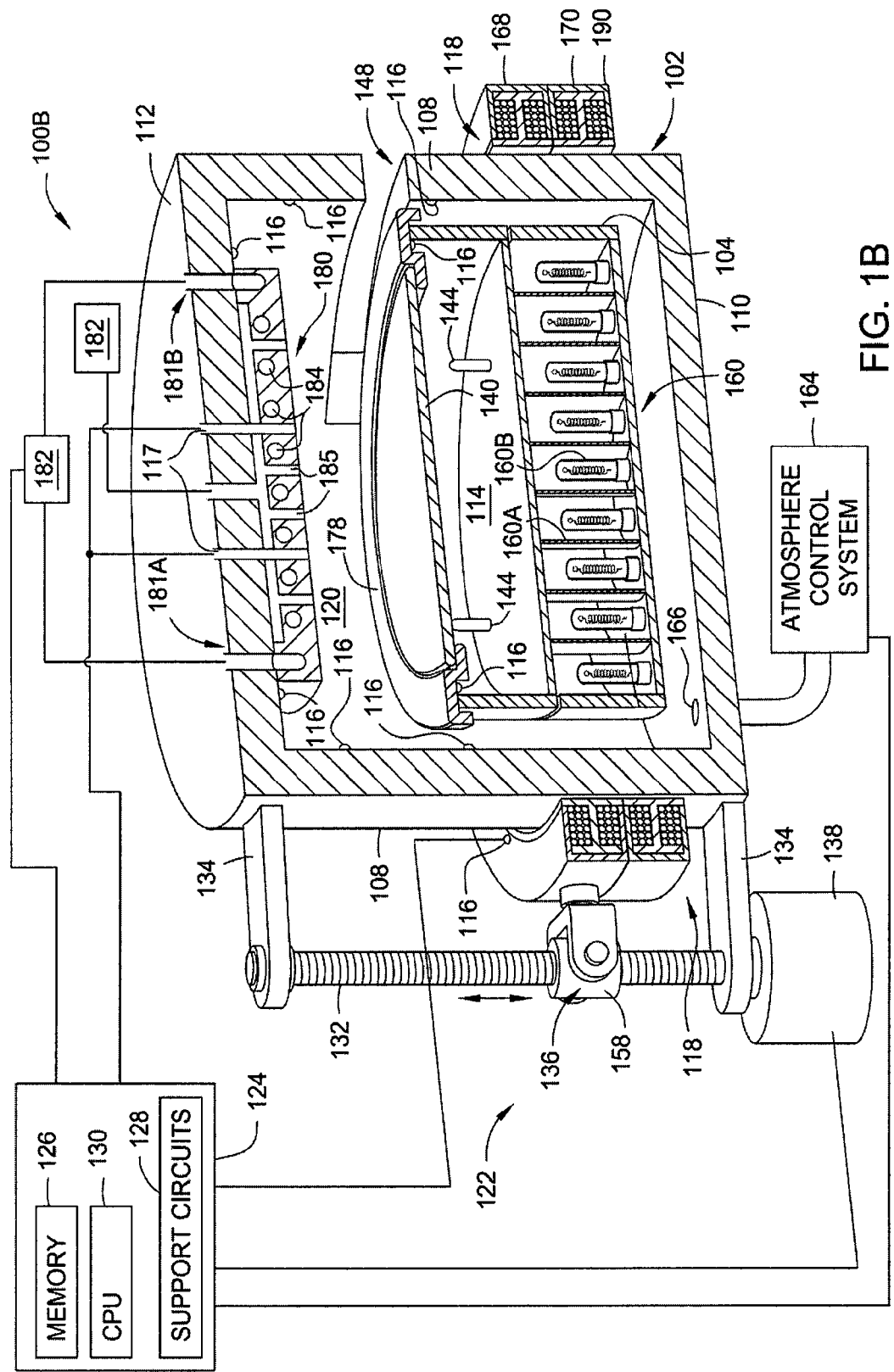

FIGS. 1A and 1B are isometric sectional views of chambers according to embodiments of the invention. FIG. 1A illustrates a chamber 100A, such as an RTP chamber. The chamber 100A includes a magnetically levitated substrate support 104 having an annular shape, a chamber body 102 having walls 108, a bottom 110, and a top 112 defining an interior volume 120. The walls 108 typically include at least one substrate access port 148 to facilitate ingress and egress of a substrate 140. The access port may be coupled to a transfer chamber (not shown) or a load lock chamber and may be selectively sealed with a valve, such as a slit valve. The chamber 100A includes a radiant heat source 106 disposed in an inside diameter of the substrate support 104. The radiant heat source is configured to heat the substrate 140 to a desired process temperature during a rapid thermal annealing process.

The substrate support 104 is adapted to magnetically levitate and rotate within the interior volume 120. The substrate support 104 is capable of rotating while raising and lowering vertically during processing, and may also be raised or lowered without rotation before, during, or after processing. The raising and lower of the substrate support 104 allows the substrate 140 to be positioned in heating position, a cooling position, or a removal position. The magnetic levitation and/or magnetic rotation prevents or minimizes particle generation due to the absence or reduction of moving parts typically required to raise/lower and/or rotate the substrate support. The substrate support 104 includes an edge ring 178 that circumscribes the substrate 140 and supports the substrate 140 during processing.

The chamber 100A also includes a window 114 made from a material transparent to heat and light of various wavelengths, which may include light in the infra-red (IR) spectrum, through which photons from the radiant heat source 106 may heat the substrate 140. In one embodiment, the window 114 is made of a quartz material, although other materials that are transparent to light may be used, such as sapphire. The window 114 may also include a plurality of lift pins 144 coupled to an upper surface of the window 114, which are adapted to selectively contact and support the substrate 140 to facilitate transfer of the substrate 140 into and out of the chamber 100A. Each of the plurality of lift pins 144 are configured to minimize absorption of energy from the radiant heat source 106 and may be made from the same material used for the window 114, such as a quartz material. The plurality of lift pins 144 may be positioned and radially spaced from each other to facilitate passage of an end effector coupled to a transfer robot (not shown). Alternatively, the end effector and/or robot may be capable of horizontal and vertical movement to facilitate transfer of the substrate 140.

The radiant heat source 106 includes a lamp assembly formed from a housing which includes a plurality of tubes 160. Each tube 160 includes a reflector 160A and a high-intensity lamp 160B or an IR emitter. This close-packed hexagonal arrangement of pipes provides radiant energy sources with high-power density and good spatial resolution. In one embodiment, the radiant heat source 106 provides sufficient radiant energy to thermally process the substrate, for example, annealing a silicon layer disposed on the substrate 140. The radiant heat source 106 may further comprise annular zones, wherein the voltage supplied to the plurality of tubes 160 by the controller 124 may vary to enhance the radial distribution of energy from the tubes 160. Dynamic control of the heating of the substrate 140 may be effected by one or more temperature sensors 117 adapted to measure the temperature across the substrate 140.

A stator 118 circumscribes the walls 108 of the chamber body 102 and is coupled to one or more actuator assemblies 122 that control the elevation of the stator 118 along the exterior of the chamber body 102. The stator 118 is magnetically coupled to the substrate support 104 disposed within the interior volume 120 of the chamber body 102. The substrate support 104 may include a magnetic portion to function as a rotor, thus creating a magnetic bearing assembly to lift and/or rotate the substrate support 104. The stator 118 also includes a housing 190 to enclose various parts and components of the stator 118. The stator 118 includes a drive coil assembly 168 stacked on a suspension coil assembly 170. The drive coil assembly 168 is adapted to rotate and/or raise/lower the substrate support 104 while the suspension coil assembly 170 may be adapted to passively center the substrate support 104 within the processing chamber 100A. Alternatively, the rotational and centering functions may be performed by a stator having a single coil assembly.

Each of the actuator assemblies 122 generally comprises a precision lead screw 132 coupled between two flanges 134 extending from the walls 108 of the chamber body 102. The lead screw 132 has a nut 158 that axially travels along the lead screw 132 as the screw rotates. A coupling 136 is coupled between the stator 118 and nut 158 so that as the lead screw 132 is rotated, the coupling 136 is moved along the lead screw 132 to control the elevation of the stator 118 at the interface with the coupling 136. Thus, as the lead screw 132 of one of the actuators 122 is rotated to produce relative displacement between the nuts 158 of the other actuators 122, the horizontal plane of the stator 118 changes relative to a central axis of the chamber body 102. A motor 138, such as a stepper or servo motor, is coupled to the lead screw 132 to provide controllable rotation in response to a signal by a controller 124.

The controller 124 generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

An atmosphere control system 164 is in fluid communication with the interior volume 120 of the chamber body 102 through an exhaust port 166. The atmosphere control system 164 generally includes one or more high-speed throttle valves and/or plunger-style gate valves, as well as one or more vacuum pumps, for controlling chamber pressure and exhausting gases from the interior volume 120. A gas source 165 is in fluid communication with the interior volume 120 for providing process gases or other gases to the interior volume 120 through a gas inlet 167. The gas inlet 167 is generally disposed opposite the exhaust port 166 to create a parallel flow of process gas across the surface of the substrate 140. When the substrate support 104 is located in close proximity to the cooling plate 180, such as about 1 millimeter or less, the flow of process across the surface of the substrate 140 is turbulent. Turbulent flow of the process gas enhances the transfer of heat from the substrate 140 to the cooling plate 180 when cooling the substrate 140.

The chamber 100A also includes one or more sensors 116, which are generally adapted to detect the position of the substrate support 104 (or substrate 140) within the interior volume 120 of the chamber body 102. The sensors 116 are coupled to the chamber body 102 of the chamber 100A and are adapted to provide an output indicative of the distance between the substrate support 104 and the top 112 and/or bottom 110 of the chamber body 102, and may also detect misalignment of the substrate support 104 and/or substrate 140. Additionally, the sensors 116 may be utilized to determine the distance between the cooling plate 180 and the substrate 140 and/or the edge ring 178. While a plurality of sensors 116 are shown, it is to be understand that not all the sensors 116 which are shown may be necessary to determine relative distances within the chamber 100A. Thus, it is contemplated that some of the sensors 116 may be omitted or located in positions other than those shown.

The one or more sensors 116 are coupled to the controller 124 that receives the output metric from the sensors 116 and provides a signal or signals to the one or more actuator assemblies 122 to raise or lower at least a portion of the substrate support 104. The controller 124 may utilize a positional metric obtained from the sensors 116 to adjust the elevation of the stator 118 at each actuator assembly 122 so that both the elevation and the planarity of the substrate support 104 and substrate 140 seated thereon may be adjusted relative to a central axis of the chamber 100A and/or the radiant heat source 106 and/or the cooling plate 180. For example, the controller 124 may provide signals to raise the substrate support by action of one actuator 122 to correct axial misalignment of the substrate support 104, or the controller may provide a signal to all actuators 122 to facilitate simultaneous vertical movement of the substrate support 104.

The one or more sensors 116 may be ultrasonic, laser, inductive, capacitive, optical tri-angular, interferometer, magnetic, or other type of sensor capable of detecting the proximity of the substrate support 104 within the chamber body 102. The sensors 116, may be coupled to the chamber body 102 proximate the top 112 or coupled to the walls 108, although other locations within and around the chamber body 102 may be suitable, such as coupled to the stator 118 outside of the chamber 100. In one embodiment, one or more sensors 116 may be coupled to the stator 118 and are adapted to sense the elevation and/or position of the substrate support 104 (or substrate 140) through the walls 108. In this embodiment, the walls 108 may include a thinner cross-section to facilitate positional sensing through the walls 108. In another embodiment, a plurality of sensors 116, such as three sensors 116, may be spaced around the perimeter of the substrate 140, such as on the edge ring 178. In yet another embodiment, a plurality of sensors 116 may be disposed within the cooling plate 180. In such an embodiment, the sensors may be positioned at different radii, and in one example, may extend radially outward along a straight line.

The chamber 100A also includes one or more temperature sensors 117, which may be adapted to sense a temperature of the substrate 140 before, during, and after processing. In the embodiment depicted in FIG. 1A, the temperature sensors 117 are disposed through the top 112, although other locations within and around the chamber body 102 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate. The sensors 117 may comprise a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate.

The chamber 100A also includes a cooling plate 180 coupled to the top 112 of the chamber 100A within the interior volume 120. The cooling plate 180 is spaced apart from and opposing the radiant heat source 106. The cooling plate 180 comprises one or more coolant channels 184 coupled to an inlet 181A and an outlet 181B. The coolant channels 184 are adapted to flow a coolant therethrough. The cooling plate 180 may be made of a process resistant material, such as stainless steel, aluminum, a polymer, or a ceramic material. The coolant channels 184 may comprise a spiral pattern, a rectangular pattern, a circular pattern, or combinations thereof and the coolant channels 184 may be formed integrally within the cooling plate 180, for example by casting the cooling plate 180 and/or fabricating the cooling plate 180 from two or more pieces and joining the pieces. Additionally or alternatively, the coolant channels 184 may be drilled into the cooling plate 180.

The cooling plate 180 may be formed from a material such as aluminum, stainless steel, nickel, a ceramic, or a process resistant polymer. The cooling plate 180 may comprise a reflective material, or include a reflective coating configured to reflect heat onto the surface of the substrate 140. Alternatively, the cooling plate 180 may comprise a black material (such as a black material configured to absorb energy substantially similar to a black body) or otherwise coated or finished with a black material or surface that is configured to absorb heat from the substrate 140 and/or the interior volume 120. The face or outer surface may be roughened or polished to promote reflectivity or absorption of radiant energy in the form of heat and/or light. The outer surface may also include a coating or finish to promote reflectivity or absorption, depending on the process parameters. In one embodiment, the cooling plate 180 may be a black material or a material resembling a black material, or otherwise coated or finished with a black material or resembling a black material, to have an emissivity or emittance near 1, such as an emissivity between about 0.70 to about 0.95.

The chamber 100A is adapted to receive a substrate in a "face-up" orientation, wherein the deposit receiving side or face of the substrate is oriented toward the cooling plate 180 and the "backside" of the substrate is facing the radiant heat source 106. The "face-up" orientation may allow the energy from the radiant heat source 106 to be absorbed more rapidly by the substrate 140 as the backside of the substrate is typically less reflective than the face of the substrate.

The inlet 181A and outlet 181B may be coupled to a coolant source 182 by valves and suitable plumbing. The coolant source 182 may be in communication with the controller 124 to facilitate control of pressure and/or flow of a fluid disposed therein. The fluid may be water, ethylene glycol, nitrogen ($N_2$), helium (He), or other fluid used as a heat exchange medium.

FIG. 1A illustrates one embodiment of a processing chamber 100A; however, additional embodiments are also contemplated. In another embodiment, it is contemplated that the substrate support 104 may not be magnetically levitated, and instead, may be actuated mechanically via a shaft coupled to an actuator, such as a motor. In another embodiment, the chamber 100A may include three actuator assemblies 122 disposed radially about the chamber body, for example, at about 120° angles about the chamber body 102. In another embodiment, the motor 138 may be another type of actuator, such as a pneumatic cylinder, hydraulic cylinders, ball screw, solenoid, linear actuator and cam follower, among others. In another embodiment, a plurality of sensors 117 may be disposed in a line extending radially from about the center of the top 112 to a peripheral portion of the top 112. In this manner, the radius of the substrate may be monitored by the sensors 117, which will enable sensing of the diameter of the substrate during rotation.

Although the cooling plate 180 and radiant heat source 106 are described as being positioned in an upper and lower portion of the interior volume 120, respectively, the position of the cooling plate 180 and the radiant heat source 106 may be reversed. For example, the cooling plate 180 may be sized and configured to be positioned within the inside diameter of the substrate support 104, and the radiant heat source 106 may be coupled to the top 112. In this arrangement, the window 114 may be disposed between the radiant heat source 106 and the substrate support 104, such as adjacent the radiant heat source 106 in the upper portion of the chamber 100A. Although the substrate 140 may absorb heat more readily when the backside is facing the radiant heat source 106, the substrate 140 could be oriented in a face-up orientation or a face down orientation in either configuration.

FIG. 1B illustrates a chamber 100B according to another embodiment. The chamber 100B is similar to the chamber 100A, except that process gases are introduced into the interior volume 120 through gas channels 185 formed within the cooling plate 180. The gas channels direct process gases downward perpendicular to the upper surface of the substrate 140. The perpendicular flow of process gas relative to the surface of the substrate 140, particularly during elevation of the substrate support 104, maintains the position of the substrate 140 on the substrate support 104 be creating a downward force on the upper surface of the substrate 140. The chamber 100B, process gases are removed from the interior volume 120 by the atmosphere control system 164 through an exhaust port 166 formed through the bottom 110.

Figure 1C:
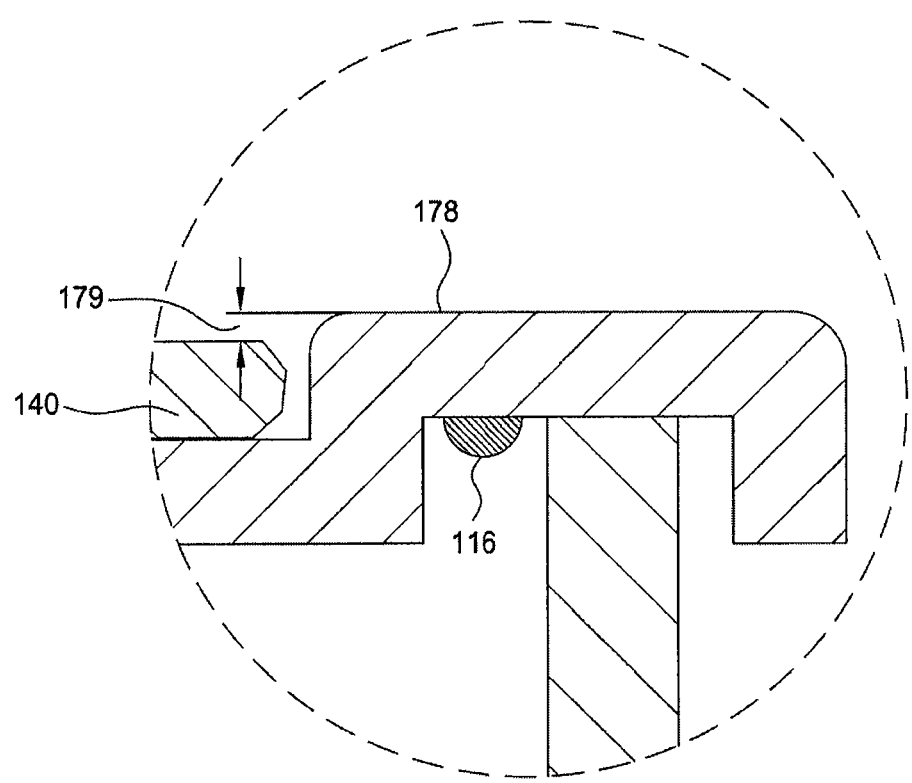
FIG. 1C illustrates an enlarged partial view of the edge ring shown in FIGS. 1A and 1B.

FIG. 1C illustrates an enlarged partial view of the edge ring 178 shown in FIGS. 1A and 1B. The upper surface of the substrate 140 is disposed below the upper surface of the edge ring 178 by a distance 179 to protect the edge of the substrate 140 during processing. In one example, the distance 179 may be about 0.5 millimeters. Because the upper surface of the substrate 140 is disposed below the upper surface of the edge ring 178, process gases moving horizontally across the surface of the substrate 140 during processing do not push against the side of the substrate 140, which may cause the substrate 140 to be undesirably forced into contact with the edge ring 178. Forcing the substrate 140 into contact with the edge ring 178 may result in chipping or cracking of the substrate 140.

It is contemplated in some embodiments that the upper surface of the edge ring 178 may be disposed below or equal to the upper surface of the substrate 140. In such an embodiment, the substrate 140 may be positioned closer to the cooling plate 180 during substrate cooling, since the height of the edge ring 178 does not impede placement of the substrate 140 relative to the cooling plate 180. In yet another embodiment, it is contemplated that the edge ring 178 may extend beyond the surface of the substrate 140; however, the diameter of the cooling plate 180 may be less than the internal diameter of the edge ring 178. Because the diameter of the cooling plate 180 is less than the internal diameter of the edge ring 178, the substrate 140 can be elevated into close proximity with the cooling plate 180 without hindrance from the edge ring 178. In such an embodiment, the substrate 140 may be advantageously placed in close proximity with the cooling plate 180 while still fully protecting the edges of the substrate 140 with the edge ring 178.

Figure 2:
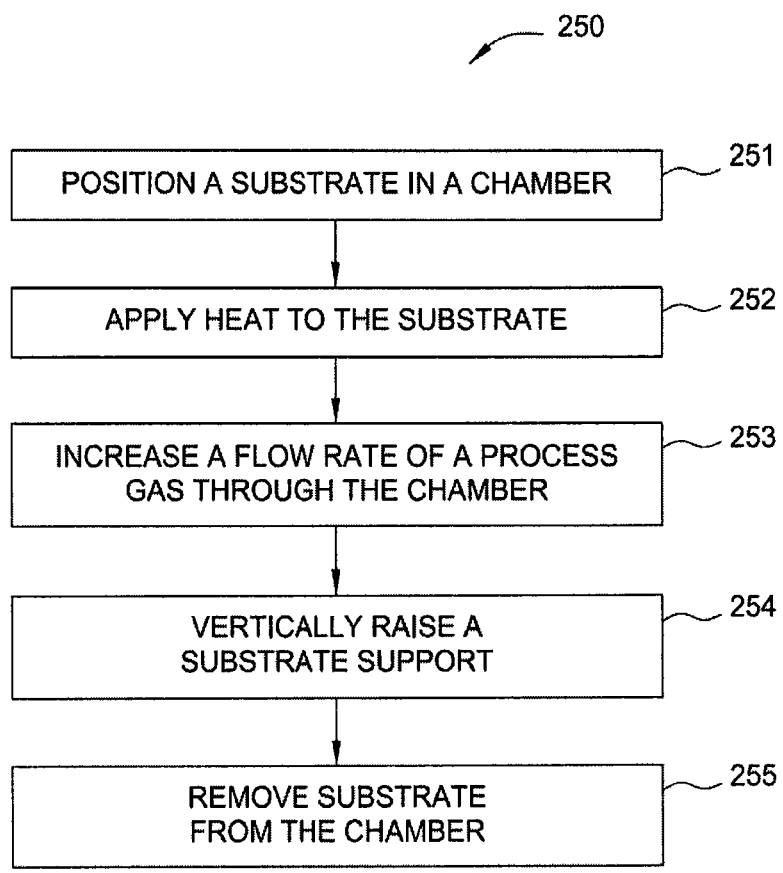
FIG. 2 is a flow diagram illustrating a rapid thermal annealing process according to one embodiment of the invention.

FIG. 2 is a flow diagram 250 illustrating a rapid thermal annealing process according to one embodiment of the invention. The rapid thermal annealing process begins at operation 251, in which a substrate is positioned on a substrate support within a chamber, such as an RTP chamber. The substrate may be, for example, a silicon substrate such as a silicon wafer. In operation 252, with the substrate positioned on the substrate support, the substrate is rapidly heated (for example, at about 300 degrees Celsius per second) to a desired temperature. In one embodiment, the desired temperature may be greater than 600 degrees Celsius, such as about 800 degrees Celsius to about 1200 degrees Celsius. During the heating of the substrate, a process gas, for example an inert gas such as nitrogen, helium or argon is introduced to the interior volume of the chamber. The process gas is introduced into and removed from the interior volume at a flow rate of about 2 SLM. The process gas generally has a laminar flow during heating of the substrate.

In operation 253, after the temperature of the substrate is elevated to the desired temperature, heating of the substrate is halted. Substantially simultaneously with the cessation of heat application, the flow rate of the process gas through the interior volume is increased. The increased flow rate of the process gas facilitates quicker cooling of the substrate due to the increased heat carrying capacity which accompanies the increased gas flow rate. Thus, the substrate residence time is reduced. The flow rate of the process gas may be increased five-fold or more, for example, to about 10 SLM or more. The process gas is generally provided to the chamber at ambient temperature. The introduction and removal of the process gas is facilitated using high speed valves 183, which may be electronically controlled, and can be fully opened in about 0.25 seconds or less. The fast-opening high speed valves 183 reduce residence time of the substrate by providing and removing gas more quickly, thereby increasing the cooling rate of the substrate. When utilizing the fast-opening high speed valves 183 at a flow rate of process gas of about 10 SLM or more, the temperature of the substrate can be reduced about 50 degrees Celsius in about 0.8 seconds. In comparison, when cooling a substrate using a constant gas flow rate of about 2 SLM, the substrate temperature is reduced 50 degrees in about 1.0 to about 1.2 seconds. Thus, the increased flow rate of the process gas provides a significant reduction in cooling time.

After increasing the flow rate of process gas through the interior volume, the substrate support and substrate thereon are elevated to a position in closer proximity with the cooling plate. Thus, the substrate is heated (e.g., during operation 252) while located a first distance from the cooling plate, and cooled (e.g., during operation 254) at a second distance from the cooling plate less than the first distance. The substrate and substrate support may be rotated during elevation and while elevated (e.g., located in a cooling position). The closer proximity of the substrate with respect to the cooling plate increases the cooling rate of the substrate, thus reducing the residence time of the substrate. By positioning the substrate closer to the cooling plate, such as at a distance of about 100 microns to about 1 millimeter, for example, 100 microns to about 200 microns, the cooling plate and the cooling fluid therein can advantageously remove heat from the substrate via radiation and convection (facilitated by the process gas located therebetween). At distances greater than about 2 millimeters, cooling of the substrate via fluid in the cooling plate 180 is considerably reduced. When the substrate support is elevated to a position closer to the cooling plate, such as about less than 200 microns, the time required to reduce the temperature of the substrate 50 degrees Celsius is about 0.6 seconds or less when utilizing an process gas flow rate of about 10 SLM. In operation 256, after the substrate is cooled to a desired temperature, the substrate may be removed from the chamber.

FIG. 2 illustrates one embodiment of a rapid thermal annealing process, however, other embodiments are also contemplated. In another embodiment, it is contemplated that one of either operation 253 or operation 254 may be omitted. In another embodiment, it is contemplated that operations 253 and 254 may occur substantially simultaneously.

While an increased process gas flow rate and a reduced proximity between a cooling plate and a substrate each provide a reduction in cooling time, it is believed that the combination provides a synergistic effect which further reduces cooling time. Because of the relatively close positioning (for example, about 100 microns to about 200 microns) of the substrate to the cooling plate during operation 254, combined with the increased process gas flow rate, a turbulent flow of process gas results as the process gas flows over the surface of the substrate. The turbulent flow of the process gas near the substrate surface facilitates convective cooling of the substrate. As the process gas removes heat from the substrate, the process gas is quickly removed from an area near the substrate surface so that fresh, unheated process gas may contact the substrate to facilitate increased heat removal. Additionally, the turbulent flow of the process gas also places heated process gas near the surface of the cooling plate which allows heat to be more quickly extracted.

Benefits of the present invention include reduced residence time during rapid thermal processing of substrates. Residence time is reduced by increasing the cooling efficiency of the chamber in which substrates are processed. Cooling efficiency is increased by providing a higher gas flow rate through the chamber, which is facilitated by a high speed valve 183, and/or by positioning the substrate in close proximity to a cooling plate which has a cooling fluid flowing therethrough. The reduced residence time facilitates shallow junction formation on substrate devices.

Benefits of the present invention include reduced residence time during rapid thermal processing of substrates. Residence time is reduced by increasing the cooling efficiency of the chamber in which substrates are processed. Cooling efficiency is increased by providing a higher gas flow rate through the chamber, which is facilitated by a high speed valve 183, and/or by positioning the substrate in close proximity to a cooling plate which has a cooling fluid flowing therethrough. The reduced residence time facilitates shallow junction formation on substrate devices.

While the foregoing is directed to embodiments of the present invention, other and further embodiments of the invention may be devised without departing from the basic scope thereof, and the scope thereof is determined by the claims that follow.

We claim:

1. A method of processing a substrate, comprising:
   positioning a substrate on a substrate support within a chamber, the substrate positioned a first distance from a cooling plate within the chamber;

applying heat to a substrate to increase a temperature of the substrate to a predetermined temperature, wherein a process gas is provided to the chamber while applying heat to the substrate;

ceasing the application of heat after the substrate has reached the predetermined temperature;

increasing a flow rate of the process gas provided to and removed from the chamber;

positioning the substrate a second distance from the cooling plate, wherein the second distance is less than the first distance;

decreasing the temperature of the substrate; and removing the substrate from chamber.

2. The method of claim 1, wherein ceasing the application of heat occurs substantially concurrently with increasing the flow rate of the process gas.

3. The method of claim 2, wherein the positioning the substrate a second distance from the cooling plate occurs substantially concurrently with ceasing the application of heat and increasing the flow rate of the process gas.

4. The method of claim 1, wherein the increasing a flow rate of the process gas provided to and removed from the chamber is facilitated by use of a high speed electric valve.

5. The method of claim 1, wherein the increasing a flow rate of the process gas provided to and removed from the chamber comprises increasing the flow rate five-fold or more.

6. The method of claim 1, wherein the second distance is within a range of about 100 microns to about 200 microns.

7. The method of claim 1, wherein an edge ring is disposed around a periphery of the substrate, and wherein the edge ring has an internal diameter greater than the diameter of the cooling plate.

8. The method of claim 1, wherein the process gas has a turbulent flow during the decreasing the temperature of the substrate.

9. The method of claim 1, wherein the process gas comprises nitrogen, helium, or argon.

10. The method of claim 1, wherein the process gas flows parallel to an upper surface of the substrate.

11. A method of processing a substrate, comprising:

positioning a substrate on a substrate support within a chamber, the substrate positioned a first distance from a cooling plate within the chamber;

applying heat to a substrate using a plurality of lamps to increase a temperature of the substrate to a predetermined temperature, wherein a process gas comprising nitrogen, argon, or helium is provided to the chamber while applying heat to the substrate;

ceasing the application of heat after the substrate has reached the predetermined temperature;

increasing a flow rate of the process gas provided to and removed from the chamber using a high speed electric valve;

positioning the substrate a second distance from the cooling plate, wherein the second distance is less than the first distance;

decreasing the temperature of the substrate; and removing the substrate from chamber.

12. The method of claim 11, wherein the process gas is provided to the chamber through openings disposed within the cooling plate.

13. The method of claim 11, wherein the process gas flows parallel to an upper surface of the substrate.

14. The method of claim 11, wherein decreasing the temperature of the substrate comprises decreasing the temperature of the substrate about 50 degrees Celsius in about 0.6 seconds or less.

15. The method of claim 11, wherein an edge ring is disposed around the circumference of the substrate, and wherein the edge ring has an upper surface positioned above an upper surface of the substrate.

16. The method of claim 11, wherein an edge ring is disposed around the circumference of the substrate, and wherein the edge ring has an upper surface positioned below an upper surface of the substrate.

17. The method of claim 11, wherein the second distance is within a range of about 100 microns to about 200 microns.

18. The method of claim 11, wherein the cooling plate has a coolant flowing therethrough.

19. The method of claim 11, wherein the process gas is introduced into the chamber in a direction perpendicular to an upper surface of the substrate.

20. A method of processing a substrate, comprising:

positioning a substrate on a substrate support within a chamber, the substrate having an edge ring disposed therearound;

applying heat to a substrate using a plurality of lamps to increase a temperature of the substrate to a predetermined temperature greater than about 600 degrees Celsius, wherein a process gas comprising nitrogen, argon, or helium is provided to the chamber while applying heat to the substrate;

ceasing the application of heat after the substrate has reached the predetermined temperature;

increasing a flow rate of the process gas provided to and removed from the chamber using a high speed electric valve;

positioning the substrate about 100 microns to about 200 microns from a cooling plate;

decreasing the temperature of the substrate; and removing the substrate from chamber.

* * * * *

UNITED STATES PATENT AND TRADEMARK OFFICE
CERTIFICATE OF CORRECTION

PATENT NO. : 8,939,760 B2  
APPLICATION NO. : 13/370164  
DATED : January 27, 2015  
INVENTOR(S) : Li et al.

Page 1 of 1

It is certified that error appears in the above-identified patent and that said Letters Patent is hereby corrected as shown below:

In the specification,

Column 8, Lines 46-60, please delete "Benefits of the present invention include reduced residence time during rapid thermal processing of substrates. Residence time is reduced by increasing the cooling efficiency of the chamber in which substrates are processed. Cooling efficiency is increased by providing a higher gas flow rate through the chamber, which is facilitated by a high speed valve 183, and/or by positioning the substrate in close proximity to a cooling plate which has a cooling fluid flowing therethrough. The reduced residence time facilitates shallow junction formation on substrate devices.".

Signed and Sealed this  
First Day of December, 2015

Michelle K. Lee  
*Director of the United States Patent and Trademark Office*